United States Patent [19]
Heikkilä et al.

[11] Patent Number: 5,638,034
[45] Date of Patent: Jun. 10, 1997

[54] METHOD AND ARRANGEMENT FOR TUNING A COMBINER FILTER

[75] Inventors: Pekka Heikkilä; Eero Koukkari; Seppo Nousiainen; Juha Vasanoja; Martti Kainulainen; Jukka Kyllönen, all of Oulu, Finland; Teuvo Haukipuro, Hong Kong, Hong Kong; Esa Niemitalo; Harri Tikka, both of Oulu, Finland

[73] Assignee: Nokia Telecommunications Oy, Espoo, Finland

[21] Appl. No.: 492,099

[22] PCT Filed: Dec. 29, 1993

[86] PCT No.: PCT/FI93/00564
§ 371 Date: Aug. 29, 1995
§ 102(e) Date: Aug. 29, 1995

[87] PCT Pub. No.: WO94/16495
PCT Pub. Date: Jul. 21, 1994

[30] Foreign Application Priority Data

Dec. 30, 1992 [FI] Finland ................. 925953

[51] Int. Cl.⁶ ........................ H03H 7/01; H04J 1/00
[52] U.S. Cl. ........................ 333/17.1; 333/174; 455/125
[58] Field of Search ........................ 333/17.1, 174; 455/120, 123, 125

[56] References Cited

U.S. PATENT DOCUMENTS

| | | | |
|---|---|---|---|
| 3,715,690 | 2/1973 | Young et al. | 333/17.1 |
| 4,726,071 | 2/1988 | Jachowski | 455/125 |
| 5,225,847 | 7/1993 | Roberts et al. | 333/17.3 X |

FOREIGN PATENT DOCUMENTS

| | | | |
|---|---|---|---|
| 208984 | 1/1987 | European Pat. Off. | |
| 408841 | 1/1991 | European Pat. Off. | |
| 494058 | 7/1992 | European Pat. Off. | 333/17.1 |
| 2923277 | 12/1980 | Germany. | |
| 9220149 | 11/1992 | WIPO | 333/17.1 |
| 941496 | 7/1994 | WIPO | 333/17.1 |

*Primary Examiner*—Benny T. Lee
*Assistant Examiner*—Justin P. Bettendorf
*Attorney, Agent, or Firm*—Cushman Darby & Cushman IP Group of Pillsbury Madison & Sutro LLP

[57] ABSTRACT

Tuning a combiner filter, which includes two separate tuning modes: coarse adjustment applied when the combiner is taken into use by utilizing a measuring branch for forward power and a coarse measuring branch for reflected power; and fine adjustment applied in continuous operation by utilizing the measuring branch for forward power and a fine measuring branch for reflected power. The two-stage adjustment decreases the mutual interference of the filters during tuning. The correct tuning frequency of the combiner filter is obtained as the average point of the reversing points obtained in the adjustment process, the filter being driven to the average position. This so-called positional average tuning has two advantages: the effect of noise present in the power measuring line is reduced, and the tuning error caused by the termination of the dynamics of the A/D converter positioned after the detector at low power levels and good combiner filter settings is diminished. Power measurements are made frequency-selective by mixing.

7 Claims, 4 Drawing Sheets

METHOD AND ARRANGEMENT FOR TUNING A COMBINER FILTER

BACKGROUND OF THE INVENTION

The invention relates to a method and an arrangement for tuning a combiner filter.

One known way to connect several radio transmitters to the same antenna or antenna line is to connect each radio transmitter through a separate bandpass filter having its centre frequency tuned to the transmitting frequency of the radio transmitter. Such bandpass filters are called combiner filters. The function of each combiner filter is to feed the transmitting signal of each respective radio transmitter to the antenna with the smallest possible losses and prevent the leakage of transmitting signals of different frequencies from other radio transmitters, from the direction of the antenna, to this particular radio transmitter as efficiently as possible. Conventionally, combiner bandpass filters are tuned fixedly to the transmitting frequencies of the radio transmitters. So it has not been possible to change the transmitting frequency of the radio transmitter without simultaneously changing the combiner filter or its tuning.

In certain cases, however, it is desirable that the frequencies of radio transmitters can be changed simply and rapidly. One such case is the base station of a cellular mobile radio system to which predetermined transmitting and receiving channels have been assigned. In cases where the channel allocation of the system can be altered, if desired, by varying the transmitting and receiving frequencies of the base stations, the channel capacity of the system can be utilized in a flexible and efficient way in varying conditions. Therefore combiner filters have been developed in which the centre frequency changes automatically with the transmitting frequency.

The adjustment of known automatically tunable combiner filters is based on measuring RF power reflected from the input of the filter or RF power passing through the combiner filter, and on locking to a minimum/maximum value of the measured power. A problem with this adjustment method is, however, the low adjusting accuracy and the narrow dynamic range. As the frequency selectivity of the entire adjusting system relies on the combiner filter, power components of other radio transmitters leaking through the combiner filter to its input cause the minimum reflection suppression value of the reflection suppression measurement at the filter input to be about 7 dB, which results in a narrow dynamic range for the measurement. In the adjustment method based on the measurement of the power passing through the combiner filter, the measuring dynamics of the maximum power value also remain low for the same reasons as above. In addition, the automatically tunable combiner filter based on this prior art adjustment method does not allow variation in the relative power levels between the radio transmitters, that is, the "mutual dynamics" are almost 0 dB, as a change in the power level of one transmitter affects immediately the power measurement in the adjustment circuits of the combiner filters of the other radio transmitters, thus causing adjustment error.

Finnish Patent Application 912 255 discloses an adjusting arrangement where the frequency selectivity of the measurement of the RF power passing through or reflected has been increased by mixing the RF measuring signal with a signal of the same frequency, i.e. a transmitting frequency signal, so that a substantially zero-frequency signal, i.e. a DC signal, is obtained, which has a level proportional to the RF power reflected from the input or to the RF power passing through the filter. Power components leaking from the transmitting frequencies of other radio transmitters appear in the mixing result, e.g. at a frequency of 300 kHz or at higher frequencies, which are filtered off in the lowpass filtration following the mixing. In this way the invention provides a measuring signal the level of which depends merely on the transmitting-frequency RF power component to be measured, whereas the measuring signal is not affected by the transmitting signals of the other radio transmitters.

SUMMARY OF THE INVENTION

The invention relates to a method and an arrangement for adjusting a combiner filter, which allow an efficient use of the channel capacity of radio networks in varying conditions and which improve, among other things, the measuring dynamics, adjusting accuracy and the "mutual dynamics" of the transmitters.

This is achieved by a method according to the invention, which according to the invention is characterized in that it comprises:

a) setting the centre frequency of the combiner filter at a suitable spacing from a desired channel;

b) applying an RF signal to the combiner filter;

c) measuring the RF power reflected from the combiner filter;

d) storing the measured power value;

e) stepping the centre frequency of the combiner filter towards the desired channel range until the reflected power has decreased to a predetermined portion of said stored power value;

f) stepping the centre frequency of the combiner filter and measuring the reflected power and storing it as a minimum value at each step until the minimum of the reflected power is achieved, and the minimum is passed by a few steps;

g) reversing the stepping direction of the centre frequency of the combiner filter and storing the reversing point position;

h) repeating steps f) and g) a desired number of times; and i) determining the final tuning position of the combiner filter by averaging the reversing point positions.

In the preferred embodiment of the invention, the measurement of the reflected power comprises deriving a sample signal from the RF power reflected from the combiner filter, mixing the sample signal to an intermediate frequency, detecting the power of the intermediate-frequency sample signal by rectifying.

The invention also relates to a method for fine tuning a combiner filter, which according to the invention is characterized in that it comprises a) applying an RF signal to the combiner filter; b) measuring the forward RF power passing to the combiner filter and the RF power reflected from the combiner filter; c) determining a reflection coefficient as a ratio between the measured power values, and storing the obtained reflection coefficient; d) stepping the centre frequency of the combiner filter in one direction and determining the value of the reflection coefficient and storing it as a minimum value at each step until the minimum of the value of the reflection coefficient is achieved, and the minimum is passed by a few steps; e) reversing the stepping direction of the centre frequency of the combiner filter and storing the reversing point position; f) repeating steps d) and e) a desired number of times; h) determining the final tuning position of the combiner filter by averaging the reversing point positions.

In practicing the invention, the tuning comprises two separate tuning modes: coarse adjustment applied when the filter is taken into use and fine adjustment applied in continuous operation. The two-stage adjustment reduces the mutual interference of the filters in tuning. In the methods according to the invention, the correct tuning frequency of the combiner filter is obtained as the average point of the reversing points obtained in the adjusting process, to which average point the filter is adjusted. This so-called positional average tuning has two advantages: the effect of noise present in the power measuring line is reduced, and the tuning error caused by the run-out of the dynamics of the A/D converter positioned after the detection at low power levels and with good combiner filter settings is decreased.

Power measurements can be made frequency-selective by mixing. In the preferred embodiment of the invention, the measurement of forward and reflected power comprises deriving a sample signal from the forward RF power passing to the combiner filter and the RF power reflected from the combiner filter, mixing the sample signals to an intermediate frequency, and detecting the power of the intermediate-frequency sample signals by peak value rectifying. Preferably, the spectrum of the sample signals can be weighted before detection in a manner such that the effect of centre-frequency signal components will be emphasized in the detection.

The invention further relates to an arrangement for adjusting a combiner filter, comprising means for generating a first sample signal proportional to forward RF power passing to the combiner filter and a second sample signal proportional to RF power reflected from the combiner filter; means for detecting the magnitude of the forward and reflected power by means of the first and the second sample signal; and means for adjusting the centre frequency of the combiner filter in response to the detection results of the detecting means. According to the invention, the arrangement is characterized in that the detecting means comprise a first detecting branch for detecting the first sample signal during the fine-adjustment of the combiner filter, the detecting branch containing a peak value detector and a first bandpass filter before the detector and a first lowpass filter after the detector; a second detecting branch for detecting the second sample signal during the fine-adjustment of the combiner filter, the detecting branch containing a peak value detector and a second bandpass filter before the detector and a second lowpass filter after the detector; and a third measuring branch for detecting the second sample signal during the coarse adjustment of the combiner filter, the detecting branch containing a full-wave rectifier detector and a third bandpass filter before the detector and a third lowpass filter after the detector, the bandwidth of the third bandpass filter being greater than that of the sample signal, and the bandwidth of the third lowpass filter being greater than that of the first and the second lowpass filter.

BRIEF DESCRIPTION OF THE DRAWINGS

In the following, the invention will be described by means of illustrating embodiments with reference to the attached drawings, in which:

Referring to FIG. 1, n radio transmitters Tx1 ... Txn having transmitting frequencies $f_1 \ldots f_n$, respectively, are connected through bandpass filters $1_1, 1_2, \ldots 1_n$ tuned to the respective frequencies to a common summing point P1 and further through an antenna line to a common transmitting antenna ANT. Therefore, a radio-frequency (RF) signal applied to the transmitting antenna ANT comprises the frequencies $f_1 \ldots f_n$ of all the transmitters. The transmitting frequencies $f_1 \ldots f_n$ are within the range 920–960 MHz, for instance. Such bandpass filters connecting several transmitters to a common antenna are generally referred to as combiner filters. The combiner filter allows the transmitting signal of its own transmitter to pass to the antenna line with losses as small as possible, while it at the same time prevents efficiently the entrance of the transmitting signals of different frequencies from other transmitters to its own transmitter. The invention will be described below in connection with combiner filters, in which it can be particularly advantageously applied, but the invention can also be applied in filters intended for other purposes when frequency selective power measurement is required in the frequency adjustment.

FIG. 2 showing an arrangement according to the invention for adjusting a combiner filter will now be referred to. As functional blocks, the arrangement comprises combiner blocks $1_1, 1_2, \ldots, 1_n$, of which only block $1_1$, selection blocks 21 and 22, detection block 23, and control block 24 are shown, for the sake of clarity. The tuning of the combiner filter is based on the measurement of a radio-frequency transmitting signal to determine the forward power Pf passing to an individual combiner filter and the power Pr reflected from the filter. The power of the forward signal to the combiner filter and that of the signal reflected from the combiner filter are compared with each other, and the centre frequency of the filter is adjusted such that the proportion of the power reflected from the filter to the transmitter power is at minimum. The proportion of the power transmitted to the antenna is thus as large as possible. The tuning of the combiner filter is performed by a stepper motor adjuster, which is programmed to be controlled by the control unit 24 in response to the measuring signal data concerning the forward and reflected power.

Figure 1:
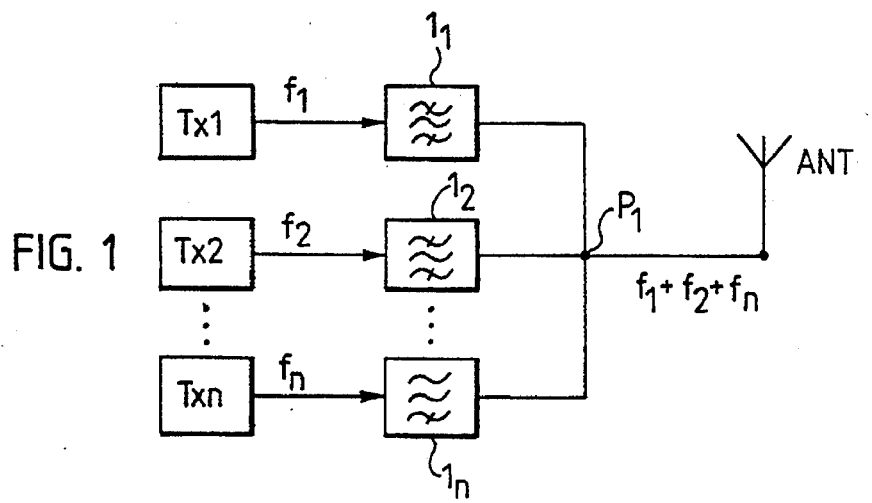
FIG. 1 is a block diagram illustrating a typical transmitter arrangement implemented by combiner filters.
Figure 2:
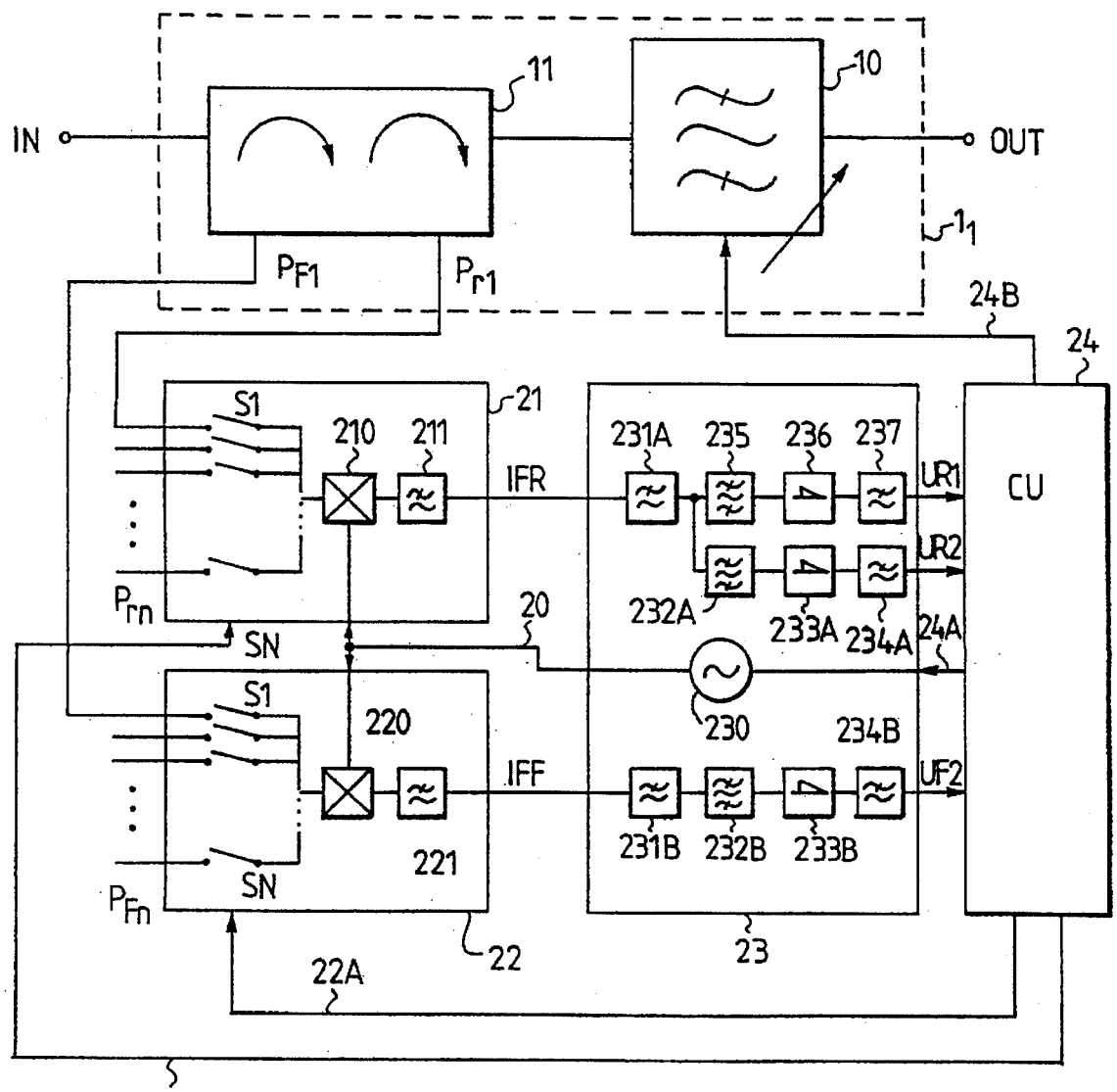
FIG. 2 is a block diagram of a switching arrangement according to the invention for adjusting a bandpass filter, wherein the power reflected from the input of the filter is measured.

Each combiner block $1_1, 1_2, \ldots, 1_n$ contains a combiner filter 10 adjusted by a stepper motor. After the filters 10 the transmitter lines are summed electrically by transmission lines of a predetermined length and applied to the antenna line. All transmitter branches comprise circulator means 11 between the transmitters and the combiner filters 10 so as to reduce the connecting of the transmitters from the antenna line to other transmitters. The circulator means 11 also derive radio-frequency samples required for the adjusting procedure from the forward power passing to the combiner filter (sample signals Pf1 ... Pfn) and from the power reflected from it (sample signals Pr1 ... Prn).

In the preferred embodiment of the invention, the combiner filter blocks have a common adjusting equipment by means of which the combiner blocks are tuned one by one. Therefore, the radio-frequency measuring signals Pf1 ... Pfn and Pr1 ... Prn from the circulator means 11 of the combiner blocks have to be selected for further processing. Selections are made in the selection block 22 for the forward power Pf and in the selection block 21 for the reflected power Pr. In the selection block 22, the signal of the combiner filter to be tuned next is selected by switches S1-Sn (e.g. RF relays) on the basis of control provided over the four-line control bus 22A of the control unit 24. Correspondingly, in the selection block 21, the signal of the combiner filter to be tuned next is selected by switches S1-Sn (e.g. RF relays) on the basis of control provided over the four-line control bus 21A of the control unit 24. The selected signals Pf and Pr are applied to mixers 220 and 210, respectively, by means of which the radio-frequency signals to be measured are mixed to a zero intermediate frequency. Local oscillator signals LO needed in the mixing are obtained from a synthesizer 230 provided in the detection block 23 and operating at the centre frequency of the transmitter channel to be tuned next. The synthesizer 230 obtains its channel control data from the control block via a bus 24A. The mixing forms the RF input signals Pf and Pr into zero-intermediate-frequency measuring signals IFF and IFR, in which the spectral components caused by the channel to be measured are at a frequency below 150 kHz and the levels of which are proportional to the levels of the radio-frequency signals Pf and Pr to be measured. As the levels of the low-frequency IF measuring signals caused by the channel to be measured are proportional to the radio-frequency powers of the combiner, the mixing allows frequency-selective power measurement. The spectral components caused at low frequencies by the transmitting signals of other transmitters connected to the combiner system occur at frequencies above 500 kHz, and they can be filtered off by means of a lowpass filter 211 and 221 provided at the output of each selection block, respectively. The filtered intermediate-frequency signals IFR and IFF are applied to the detection block 23.

The function of the detection block 23 is to detect the magnitude of the forward power to the combiner filter to be tuned next and that of the power reflected from the combiner filter from the intermediate-frequency signals IFF and IFR obtained from selector cards. The forward power measuring branch from the input IFF to the output UF2 and the reflected power measuring branch from the input IFR to the output UR2 are mutually identical in signal processing. These measuring branches are used for the continuous fine-adjustment of the combiner filter. The inputs IFR and IFF of the measuring branches comprise lowpass filters 231A and 231B (threshold frequency e.g. 130 kHz), by means of which the mixing results of other transmitters are cut off. Bandpass filters 232A and 232B (bandwidth e.g 0.5 to 30 kHz) weight the spectrum of the signals to be measured in a manner such that the effect of signal components at the centre frequencies of the transmitting channel will be emphasized in the measuring result. In this way, the inherent tendency of the mixing and measuring method to tune the combiner filter in accordance with the spectral distribution of the transmitter signal is prevented, and a good tuning accuracy is ensured. A detector 233A and 233B provided after the filter 232A and 232B, respectively, is a peak value rectifier, preferably a two-sided peak value rectifier. Two-sided peak value rectification is needed as the preceding lowpass filter causes fluctuation in the signal amplitude, which would cause measuring problems after rectification. In a TDMA-type transmission, for which the preferred embodiment of the invention is designed, the transmitter power may vary rapidly from one time slot to another (the time slot is 577 μs), so that the peak value rectification also allows the measuring dynamics to be broadened. For example, when the transmitter employs a single time slot, the measuring dynamics will be improved by about 18 dB when a slow A/D conversion is applied in the measurement taking place in the control block. After the rectifiers 233A and 233B, lowpass filters 234A and 234B (bandwidth e.g. 30 Hz), respectively, are provided to filter off any disadvantageous fluctuations remaining in the output signal after the rectification. The UF2 and UR2 signals obtained after filtering are DC signals and proportional to the peak value of the voltage of the transmitter signal passing to the combiner filter 10 and reflected from it.

The measuring branch of the detection block from the input IRF to the output UR1 is used when the combiner is taken into use, whereby the output signal of the transmitter is a test signal with a transmission of equal power in each time slot. As compared with the UR2 branch, the most significant differences are the broader bandwidth in the bandpass filter 235 before the detector 236, the use of full-wave rectification in the detector 236, and the broader bandwidth in the lowpass filter after the detector 236. The UR1 branch is designed for tuning the combiner rapidly and coarsely by utilizing a test signal, and it cannot be used for continuous adjustment. In the coarse-adjustment measuring branch the 150-kHz bandpass filter 235 at the input of the detection block 23 allows the passage of the entire power of the signal IFR to be measured to the full-wave rectifier 236. As the entire spectrum of the signal IFR is admitted to the rectifier 236, no signal fluctuation due to the shaping of the spectrum occurs at the rectifier output. The bandwidth of the filter 237 positioned after the rectifier is selected to be as broad as possible (e.g. 600 Hz) in order that the delay caused by the filter in the signal of the reflected power passing through it is small, so as to ensure rapid measuring. On the other hand, the bandwidth has to be sufficiently narrow in order that amplitude attenuations contained in the transmission at the boundaries between the time slots do not cause fluctuation at the output of the measuring line. The above-mentioned attenuation points cause spectral components at frequencies multiples of about 1,730 Hz to occur in the signal.

The output signals UF2, UR1 and UR2 from the detection block 23 are applied to the control block 24, where the A/D conversion is performed and the tuning state of the combiner to be adjusted next is calculated from the output signals. The control unit 24 has a dedicated control output for each combiner filter 10 for controlling the stepper motor.

In the following, the operation of the adjusting equipment according to the invention will be described. Each combiner filter is tuned separately. The tuning comprises two separate tuning modes: coarse adjustment used when the combiner is taken into use and fine adjustment used in continuous operation.

Coarse Adjustment

Coarse adjustment is performed when the combiner is taken into use. Upon starting the coarse adjustment, a pseudorandom-modulated transmitting signal is applied to the combiner filter 10 to be tuned from the transmitter in all TDMA time slots, the transmitting signal corresponding as closely as possible to normal transmission as far as modulation is concerned.

The measurement of the forward and reflected power of the combiner filter is made frequency-selective by utilizing mixing. At the start of the tuning, the synthesizer 230 is adjusted to the channel of the transmitter, and so the selector card mixers 210 and 220 receive the output signal LO of the synthesizer 230 of their local oscillator branch. Under the control of the control block 24, sample signals of the forward and reflected power of the channel to be tuned are selected to the RF inputs of the mixers 210 and 220 from the signals PF1-Pfn and Pr1-Prn of the different isolators 11 applied to the measuring inputs of the selector cards 21 and 22.

Stage I of the Coarse Adjustment

Figure 3:
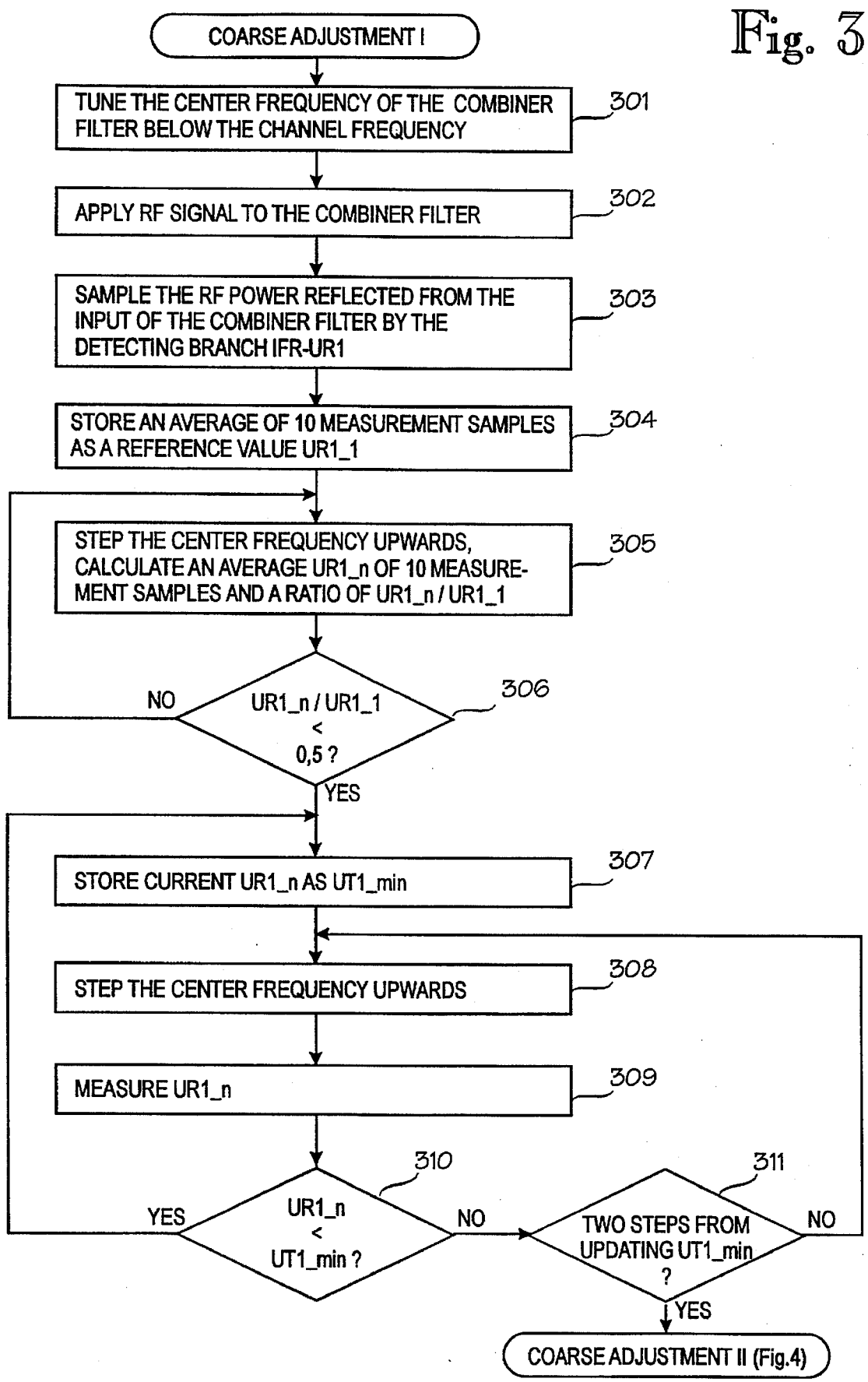
FIGS. 3, 4 and 5 are flow diagrams respectively illustrating a stage I of the course adjustment, a stage II of the course adjustment, and fine tuning, in accordance with the invention.

At stage I of the coarse adjustment, the combiner filter is tuned close to the correct tuning range. Upon starting the coarse adjustment, the combiner is tuned below the channel range (step 301, FIG. 3). When an RF signal is applied from the transmitter to the combiner filter (step 302), hardly any power is thus able to pass through the combiner filter 10 from the transmitter; in practice, all power is reflected back to the circulator 11. Ten samples, for instance, are derived from the reflected signal step (303) by means of the detecting branch IFR-UR1 (rapid measuring branch), and the samples are averaged. The result is set as a reference value UR1_1 and stored (step 304). The control unit 24 continuously steps up the tuning frequency of the filter 10, samples the reflected signal Pr at each step 10, and calculates the average UR1_n of the samples and the ratio UR1_n/UR1_1 (step 305). Upon approaching the correct tuning point of the combiner filter, the amount of power passed through the combiner filter starts to increase, and the proportion of the power reflected from the combiner filter decreases. After the power reflected from the combiner filter has decreased to one half of the original value (the ratio UR1_n/UR_1<0.5) (in step 306), the search for the minimum value of the reflected power is started, and UR1_n is stored as the minimum value UT1_min (step 307). The stepper motor is stepped up and the minimum is searched for in the reflected signal (step 308). Power is measured at each step (step 309) and each new minimum value measured is stored as the new reference value (steps 310 and 307). Stage I of the coarse adjustment is terminated when two successive values greater than the minimum have been found after the minimum of the reflected signal, i.e. the minimum has been passed by two steps (step 311).

Stage I of the coarse adjustment is performed with all filters to be tuned. After stage I of the coarse adjustment, stage II of the coarse adjustment is immediately performed on the filters. The two-stage adjustment reduces the mutual interference of the filters during tuning.

Stage II of the Coarse Adjustment

Figure 4:
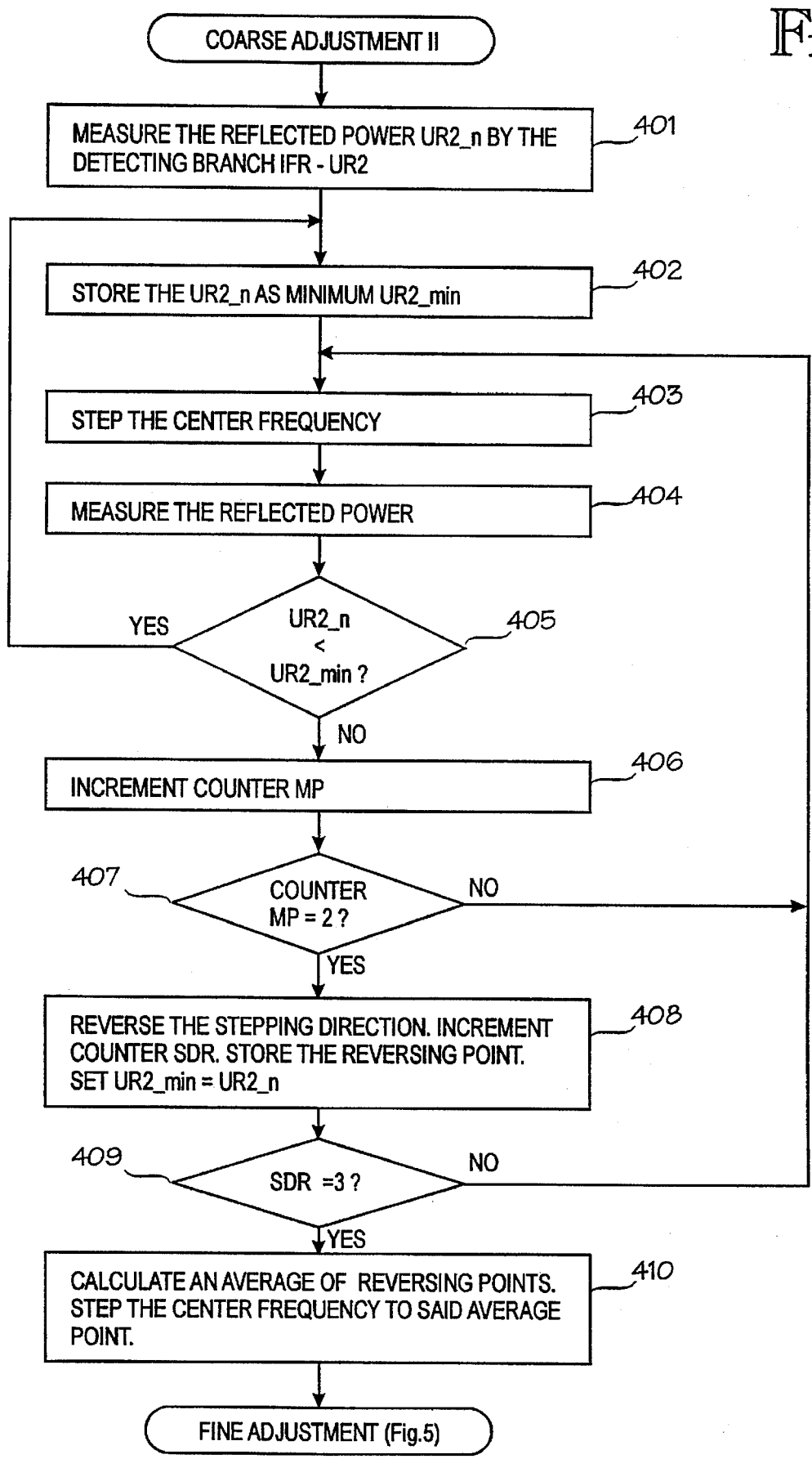

At stage II of the coarse adjustment, the reflected power is measured by means of the detecting branch IFR-UR2 (step 401, FIG. 4). At the correct tuning point of the combiner filter 10, the power reflected from the combiner filter is at minimum. The signal IFR is sampled, and the samples are summed. The result is stored as a minimum value UR2_min (step 402). The stepper motor of the filter 10 is stepped up by one step within the frequency range (step 403), and the following measuring period is performed, e.g. after 20 ms (step 404). The last measuring result UR2_n is compared with the stored minimum value (UR2_min)(step 405). If the result is smaller than or equal to the stored minimum value, the measuring result is set as the new minimum value (step 402), otherwise a minimum passing counter MP is incremented (step 406). After two successive greater values have been measured after the minimum value (step 407), the stepping direction of the stepper motor is reversed, and a stepping direction reversion counter SDR is incremented, and the measuring result of the reversing point is set as the new minimum value step (408). After the minimum (the correct tuning point) has been passed (step 405), the passing is ensured by stepping the filter up by two steps (steps 406 and 407), whereby the measured values of the reflected power are greater than the minimum value observed at the correct tuning point. The stepper motor is stepped down, and the reflected signal is measured, until two successive greater measuring values have been observed after the minimum value (steps 403–407). After the minimum value has been passed by two steps, the state of the filter is stored in the control unit, and the stepping direction of the filter is reversed (step 408). Moving back is performed step by step, and the minimum value of the reflected power is stored whenever a new minimum value is found. After the minimum has again been passed by two steps, the position of the reversing point is stored. After the reversing points have been found (step 409), the points are averaged (step 410), and the average obtained is the correct tuning point of the combiner filter. The stepper motor of the filter 10 is stepped to this point (step 410). This so-called positional average tuning has two advantages: the effect of noise present in the power measuring line UR2 is reduced, and the tuning error caused by the termination of the dynamics of the A/D converter of the control unit at low power levels and with good combiner filter settings is diminished.

Fine Adjustment

Figure 5:
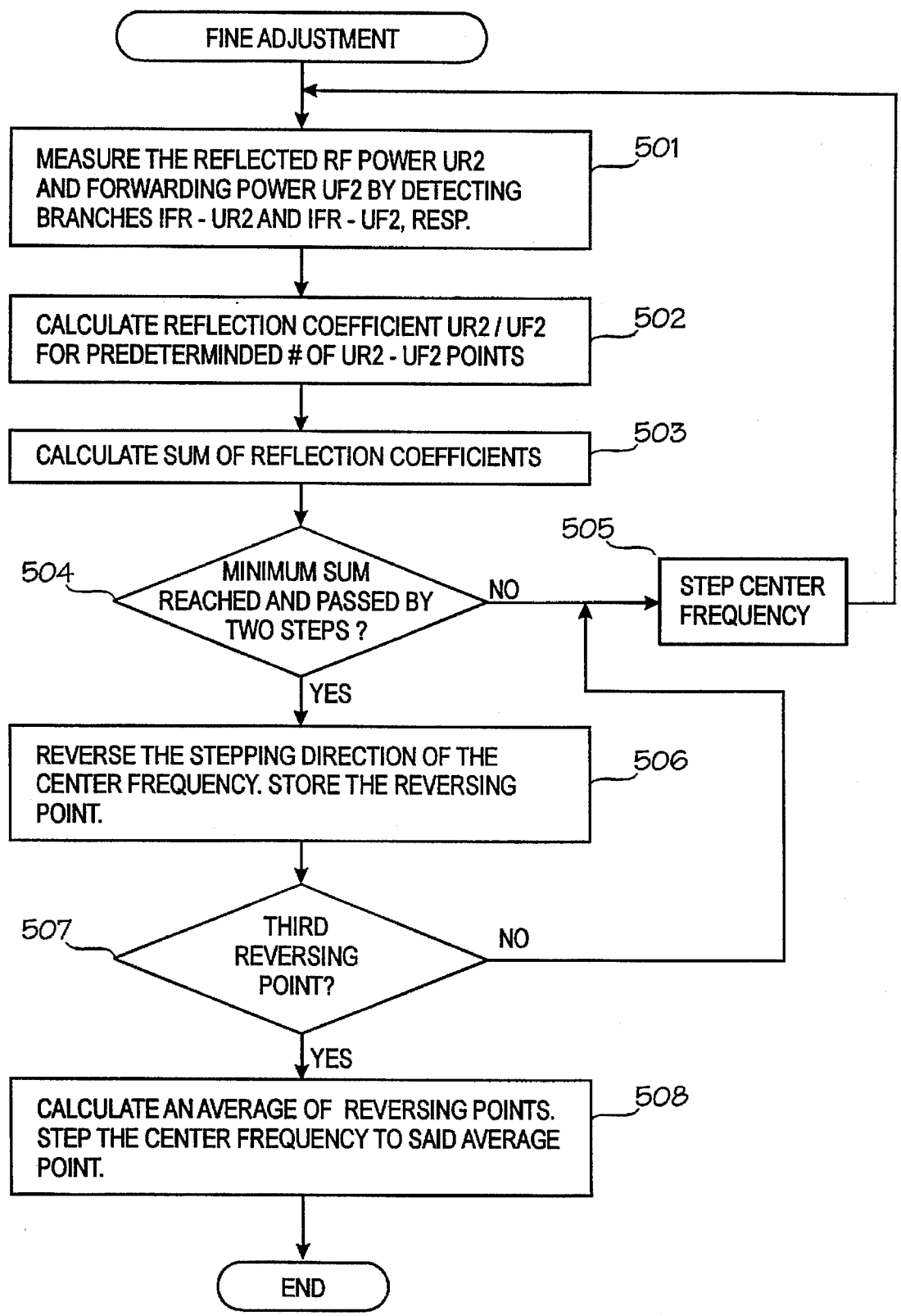

Fine adjustment is applied to a combiner filter when the radio transmitter is on. As the power of the GSM transmission normally varies from one time slot to another, the tuning state of the combiner filter cannot be monitored reliably merely by measuring the branch of the power reflected from the filter. In the fine adjustment, both the forward and the reflected signal are sampled by utilizing the measuring branches IFR-UR2 and IFF-UF2, and so the tuning state of the filter can be judged from the ratio between the measuring results UR2 and UF2 (the reflection co-efficient=UR2/UF2). In the fine adjustment, the filter is adjusted to a frequency which gives the minimum of the reflection coefficient, as described in the following with reference to FIG. 5.

In the fine adjustment, the synthesizer 230 is adjusted to the channel, and the measuring lines to the slow measuring channels of the signal passed through and reflected. The setting of the synthesizer and the measuring branches is awaited. The reflection coefficient of the starting point is measured by deriving a number of samples alternately from the signal passed through and the reflected signal (step 501). A reflection coefficient for the filter is calculated from each pair of measuring results (step 502). The reflection coefficients are summed, and fine adjustment is applied to minimize the sum of the reflection coefficients. The stepper motor is then stepped up (step 505) until the minimum value of the reflection coefficient has been passed by two steps (step 504). At this point, the stepping direction is reversed, and the value of the position counter of the filter is stored (step 506). This procedure is repeated until the minimum of the reflection coefficient of the filter has been passed two times (step 507), and the direction of the stepper motor has been reversed three times. At the third reversing point, the position counters are averaged, and the filter is set to the position indicated by the average of the position counters (step 508). The fine tuning of the filter has been completed.

Filters are fine-adjusted, e.g. in the following cases: the reflection coefficient of the filter has changed sufficiently from a preceding adjusting value; the temperature of the combiner has changed during the monitoring period; all filters are fine-adjusted at regular intervals.

The drawings and the description related to them are only intended to illustrate the invention. In its details, the invention may vary within the scope and spirit of the attached claims.

We claim:

1. A method for tuning a combiner filter, comprising the steps of:
 a) setting the centre frequency of the combiner filter at a suitable spacing from a desired radio channel having a range;

b) applying an RF signal to the combiner filter;

c) measuring the RF power reflected from the combiner filter;

d) storing the measured power value;

e) stepping the centre frequency of the combiner filter towards the range of the desired radio channel until the reflected power has decreased to a predetermined portion of said stored power value;

f) stepping the centre frequency of the combiner filter and measuring the reflected power and storing a value indicative of said reflected power as a minimum value at each step until the minimum of the reflected power is achieved, and the minimum is passed by a few steps;

g) reversing the stepping direction of the centre frequency of the combiner filter and storing the reversing point position;

h) repeating steps f) and g) a desired number of times; and i) determining the final tuning position of the combiner filter by averaging the reversing point positions obtained in steps g) and h).

2. The method according to claim 1, wherein the the step of measuring the reflected power comprises:

deriving a sample signal from the RF power reflected from the combiner filter;

mixing the sample signal to an intermediate frequency; and detecting the power of the intermediate frequency signal by rectifying.

3. A method for fine-adjusting a combiner filter having a bi-directionally steppable centre frequency, comprising the steps of:

a) applying an RF signal to the combiner filter;

b) measuring the forward RF power passing to the combiner filter and the RF power reflected from the combiner filter from conducting step a), to obtain respective measured power values;

c) determining a reflection coefficient as a ratio between the measured power values from conducting step b), and storing the obtained reflection coefficient;

d) stepping the centre frequency of the combiner filter in one direction and determining the value of the reflection coefficient and storing said reflection coefficient value as a minimum value at each step until the minimum of the value of the reflection coefficient is achieved, and the minimum is passed by a few steps;

e) reversing the stepping direction of the centre frequency of the combiner filter and storing the reversing point position;

f) repeating steps d) and e) a desired number of times; and g) determining the final tuning position of the combiner filter by averaging the reversing point positions obtained in steps e) and f).

4. The method according to claim 3, wherein the step of measuring the forward and reflected power comprises;

deriving a sample signal from the forward RF power passing to the combiner filter and the RF power reflected from the combiner filter;

mixing the sample signals to an intermediate frequency; and detecting the power of the intermediate-frequency signals by peak-value rectifying.

5. The method according to claim 4, further comprising:

weighting the spectrum of the sample signals before performing said detecting, in a manner such that the effect of centre-frequency signal components is emphasized.

6. An arrangement for adjusting a combiner filter having a centre frequency, comprising:

means for generating a first sample signal proportional to forward RF power passing to the combiner filter and a second sample signal proportional to RF power reflected from the combiner filter;

means for detecting the magnitude of the forward and reflected RF power by means of the first and the second sample signal so as to provide detection results; and means for adjusting the centre frequency of the combiner filter in response to the detection results of the detecting means;

said detecting means comprising:

a first detecting branch for detecting the first sample signal during fine-adjustment of the combiner filter, said first detecting branch containing a first peak value detector and a first bandpass filter before said first peak value detector and a first lowpass filter after said first peak value detector;

a second detecting branch for detecting the second sample signal during fine-adjustment of the combiner filter, said second detecting branch containing a second peak value detector and a second bandpass filter before said second peak value detector and a second lowpass filter after said second peak value detector; and a third detecting branch for detecting the second sample signal during course adjustment of the combiner filter, said third detecting branch containing a full-wave rectifier detector and a third bandpass filter before said full-wave rectifier detector and a third lowpass filter after said full-wave rectifier detector, said third bandpass filter having a bandwidth which is greater than that of said second sample signal, and said third bandpass filter having a bandwidth which is greater than those of said first and the second lowpass filters.

7. The arrangement according to claim 6, wherein said means for generating said sample signals comprise:

sampling means for extracting RF sample signals from the forward and reflected RF power; and means for mixing the RF sample signals to an intermediate frequency.

* * * * *